(12) United States Patent
Gordon et al.

(10) Patent No.: US 7,939,823 B2
(45) Date of Patent: May 10, 2011

(54) METHOD AND STRUCTURES FOR ACCELERATED SOFT-ERROR TESTING

(75) Inventors: Michael S. Gordon, Yorktown Heights, NY (US); Kenneth P. Rodbell, Sandy Hook, CT (US); Henry H. K. Tang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 749 days.

(21) Appl. No.: 11/852,353

(22) Filed: Sep. 10, 2007

(65) Prior Publication Data

US 2009/0065955 A1    Mar. 12, 2009

(51) Int. Cl.
*H01L 23/58* (2006.01)
*H01L 21/00* (2006.01)
(52) U.S. Cl. ........... 257/48; 257/E23.002; 257/E21.522; 257/E21.529
(58) Field of Classification Search ........... 257/48, 257/E23.002, E21.522, E21.529; 438/14
See application file for complete search history.

(56) References Cited

U.S. PATENT DOCUMENTS

| | | | | |
|---|---|---|---|---|
| 4,328,610 A | * | 5/1982 | Thompson et al. | 438/106 |
| 4,926,238 A | * | 5/1990 | Mukai et al. | 257/792 |
| 5,395,783 A | * | 3/1995 | Baumann et al. | 438/239 |
| 5,523,597 A | * | 6/1996 | Baumann et al. | 257/297 |
| 6,075,261 A | * | 6/2000 | Hossain et al. | 257/252 |
| 6,239,479 B1 | * | 5/2001 | Hwang et al. | 257/659 |
| 6,747,339 B1 | * | 6/2004 | Mukai et al. | 257/643 |
| 6,828,561 B2 | * | 12/2004 | Layman et al. | 250/370.02 |
| 6,914,447 B2 | * | 7/2005 | Baumann | 324/765 |
| 2003/0234430 A1 | * | 12/2003 | Friend et al. | 257/428 |
| 2004/0044717 A1 | * | 3/2004 | Makineni et al. | 708/530 |
| 2004/0212388 A1 | * | 10/2004 | Baumann | 324/765 |
| 2005/0163915 A1 | * | 7/2005 | Baumann | 427/5 |
| 2005/0186326 A1 | * | 8/2005 | Baumann | 427/5 |
| 2006/0220654 A1 | * | 10/2006 | Zabel et al. | 324/501 |
| 2007/0045844 A1 | * | 3/2007 | Andry et al. | 257/738 |
| 2008/0266984 A1 | * | 10/2008 | Chen et al. | 365/189.02 |
| 2008/0318365 A1 | * | 12/2008 | Andry et al. | 438/121 |

* cited by examiner

*Primary Examiner* — Evan Pert
(74) *Attorney, Agent, or Firm* — Schmeiser, Olsen & Watts; Louis J. Percello (57) ABSTRACT

An integrated circuit, method of forming the integrated circuit and a method of testing the integrated circuit for soft-error fails. The integrated circuit includes: a silicon substrate; a dielectric layer formed over the substrate; electrically conductive wires formed in the dielectric layer, the wires interconnecting semiconductor devices formed in the substrate into circuits; and an alpha particle emitting region in the integrated circuit chip proximate to one or more of the semiconductor devices. The method includes exposing the integrated circuit to an artificial flux of thermal neutrons to cause fission of atoms in the alpha particle emitting region into alpha particles and other atoms.

20 Claims, 8 Drawing Sheets

METHOD AND STRUCTURES FOR ACCELERATED SOFT-ERROR TESTING

FIELD OF THE INVENTION

The present invention relates to the field of integrated circuits; more specifically, it relates to a method and structures for accelerated soft-error testing of integrated circuits.

BACKGROUND OF THE INVENTION

Soft-errors in integrated circuits are caused by ionizing radiation striking, for example, the silicon regions of field effect transistors in memory cells or latches and changing the charge level stored in the cell or latch causing a flip in state of the cell or latch and thus generating an error. The error state is removed the next time data are written into the cell or latch. Some integrated circuits are bonded to ceramic substrates, which prevent using an external alpha-particle beam for soft-error testing since the beam often does not have the range required to get through the packaging materials. For this reason, advanced methods of soft-error rate testing utilize highly radioactive alpha particle emitters within the underfill that might present safety issues in fabricating test pieces, and possible contamination of the manufacturing and testing facilities if the test pieces are broken. Further, after testing, the devices need to be removed from the circuit boards and must be disposed of, creating disposal issues as well. Accordingly, there exists a need in the art to overcome the deficiencies and limitations for soft error testing of integrated circuits described hereinabove.

SUMMARY OF THE INVENTION

A first aspect of the present invention is an integrated circuit chip, comprising: a silicon substrate; a dielectric layer formed over the substrate; electrically conductive wires formed in the dielectric layer, the wires interconnecting semiconductor devices formed in the substrate into circuits; and an alpha particle emitting region in the integrated circuit chip proximate to one or more of the semiconductor devices.

A second aspect of the present invention is a method of fabricating an integrated circuit chip, comprising: forming a dielectric layer over a substrate; forming electrically conductive wires in the dielectric layer, the wires interconnecting semiconductor devices formed in the substrate into circuits; and forming an alpha particle emitting region in the integrated circuit chip proximate to one or more of the semiconductor devices.

A third aspect of the present invention is a method of testing for soft-error fails comprising: providing an integrated circuit chip, comprising: a silicon substrate; a dielectric layer formed over the substrate; electrically conductive wires formed in the dielectric layer, the wires interconnecting semiconductor devices formed in the substrate into circuits; and an alpha particle emitting region in the integrated circuit chip proximate to one or more of the semiconductor devices; and testing the integrated circuit chip by exposing the integrated circuit chip to a artificial flux of thermal neutrons while writing test patterns into the integrated circuit and reading out resultant patterns from the integrated circuit chip, the flux of artificial thermal neutrons generating alpha particles in the alpha particle emitting region; and comparing the resultant patterns to expected patterns to determine if fails have occurred.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Soft-errors in integrated circuits are caused by ionizing radiation, such as alpha particles passing through the semiconductor materials (e.g., silicon) of the integrated circuit. Both logic and memory circuits may be affected. The errors are called "soft" because they generally only persist until the next cycle of the integrated circuit function. As an alpha particle passes through semiconductor material (e.g., silicon) a "cloud" of electron-hole pairs is generated in the vicinity of its path. Electric fields present in the integrated circuit can cause the holes and electrons to migrate in opposite directions thus causing extra charge to reach particular circuit nodes and upset the function of the integrated circuit.

The embodiments of the present invention incorporate isotopes of elements that undergo nuclear fission to emit alpha particles ($^4$He) upon the capture of thermal neutrons (n), into integrated circuits during fabrication of the integrated circuits. After, fabrication of the integrated circuits, the integrated circuits are exposed to an artificial flux of thermal neutrons (e.g., a flux of neutrons generated in a nuclear reactor), which cause the isotopes to emit alpha particles. During this exposure to neutrons, the integrated circuit chips are monitored for soft-error fails. Alpha particle emission essentially ceases when the neutron flux is removed. Examples of two suitable isotopes for inclusion into integrated circuits that are alpha particle emitters when struck by a neutron are isotopes of lithium (Li) and Boron (B). The isotopes and their reaction with thermal neutrons are given in equations (1) and (2):

$$^{10}B + n \rightarrow {}^4He + {}^7Li \tag{1}$$

$$^{6}Li + n \rightarrow {}^4He + {}^3H \tag{2}$$

In one example, thermal neutrons utilized by the embodiments of the present invention have an energy of about 0.025 eV. In one example, thermal neutrons utilized by the embodiments of the present invention have an energy of between about 0.025 eV and about 1.0 eV. The flux of naturally occurring thermal neutrons is about $2 \times 10^{-3}$ n/cm$^2$-sec. (See, M. S. Gordon, P. Goldhagen, K. P. Rodbell, H. H. K. Tang, J. M. Clem, and P. Bailey, "Measurement of the Flux and Energy Spectrum of Cosmic-Ray-Induced Neutrons on the Ground", *IEEE Transactions on Nuclear Science*, 51, no. 6, pp. 3427-3434, (2004)) In an exemplary device, a flux of $2 \times 10^{-3}$ n/cm$^2$- sec would result in a soft-error event every $10^9$ seconds. The neutron flux utilized during testing according to the embodiments of the present invention is an artificial flux derived from nuclear reactors and are in the order of, in one example, of about $10^{13}$ n/cm$^2$-sec. In one example the artificial flux of neutron is between about $10^{11}$ n/cm$^2$-sec and about $10^{13}$ n/cm$^2$-sec. In the exemplary device, a flux of $10^{13}$ n/cm$^2$-sec would result in a soft-error event every $10^{-3}$ seconds.

Figure 1:
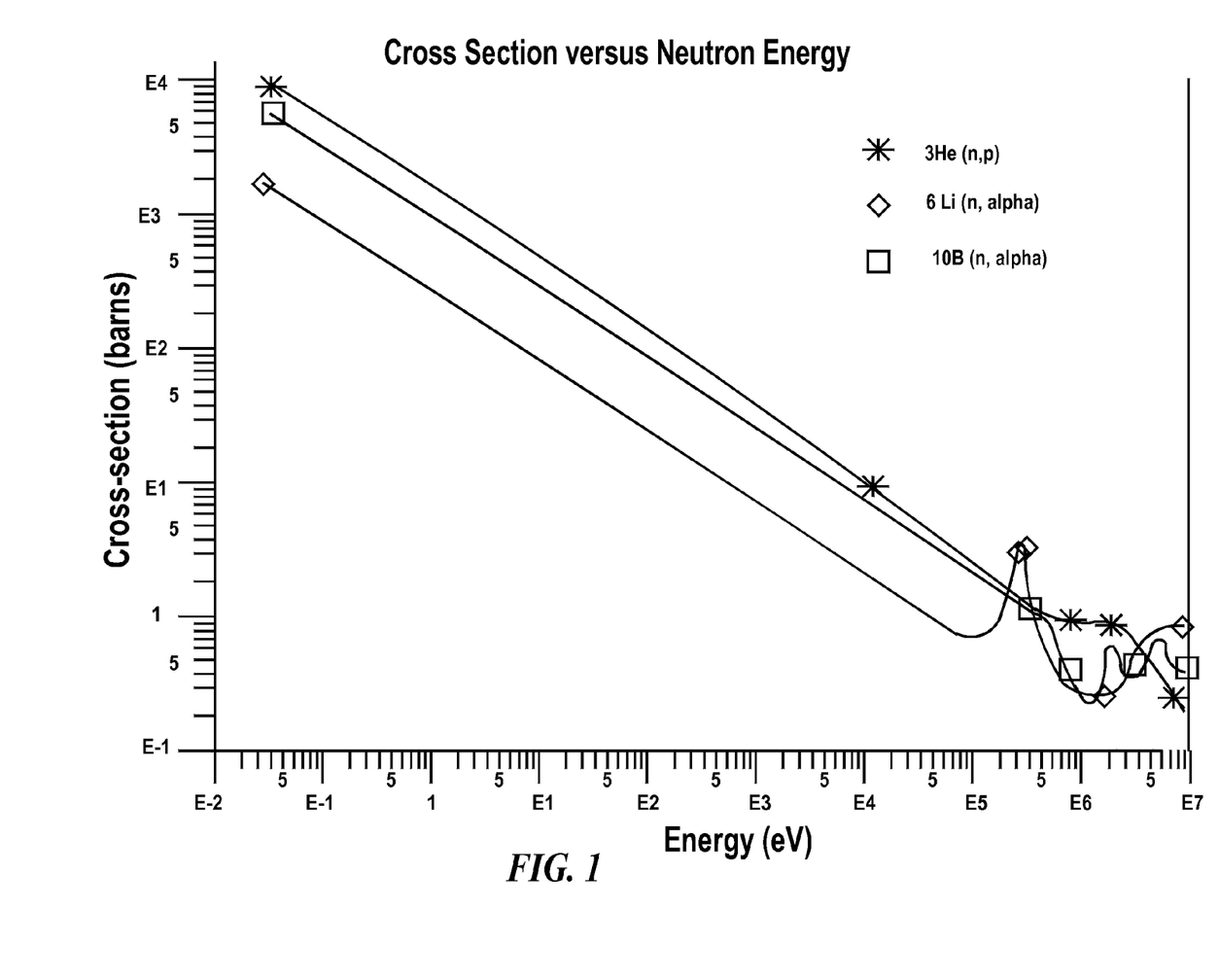
FIG. 1 is a plot of the capture cross-section versus neutron energy for atomic species of interest in the present invention.

FIG. 1 is a plot of the thermal neutron capture cross-section versus neutron energy for atomic species of interest in the present invention. In FIG. 1, the neutron capture cross-section as a function of energy is shown for $^3$He, $^6$Li and $^{10}$B. The thermal neutron capture cross-section (at 0.025 eV) of $^{10}$B is 3838 Barns and that of $^6$Li is 941 Barns. A Barn has the units of $10^{-24}$ cm$^2$. When $^{10}$B captures a thermal neutron about 94% of the time, a 1.47 MeV $^4$He is emitted and a 0.84 MeV $^7$Li ion is emitted. When $^6$Li captures a thermal neutron a 2.05 MeV $^4$He is emitted and a 2.73 MeV triton ($^3$H) are emitted. It is advantageous that the $^{10}$B and $^6$Li be located as close as possible to the silicon structures of the devices so that the resulting $^4$He ion does not lose appreciable energy traveling through material.

Figure 2:
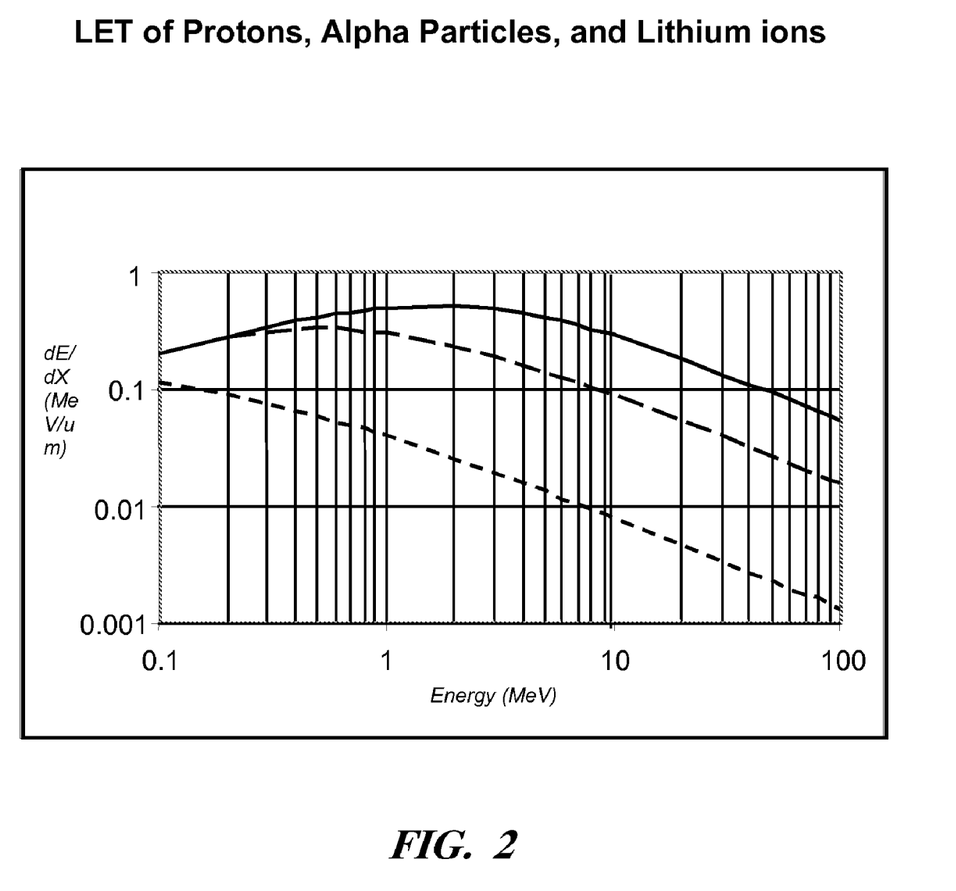
FIG. 2 is a plot showing the liner energy transfer of protons, alpha particles and lithium ions versus energy stopping in silicon.

Turning to FIG. 2, FIG. 2 is a plot showing the liner energy transfer (LET) of protons, alpha particles and lithium ions versus ion energy as the ions are stopped in silicon. The LET has the units of MeV/μm. In FIG. 2, Li is shown by the solid line, alpha particles by the long-dash dashed line and protons by the short-dash dashed line. It can be seen that 1.47 MeV $^4$He, 0.84 MeV $^7$Li, and 2.05 MeV $^4$He (see reactions 1 and 2) have high enough LETs to cause soft-error fails (i.e., they transfer significant energy sufficiently deep in the silicon to interact with the doped regions of devices, several tenths of a micron).

Figure 3A:
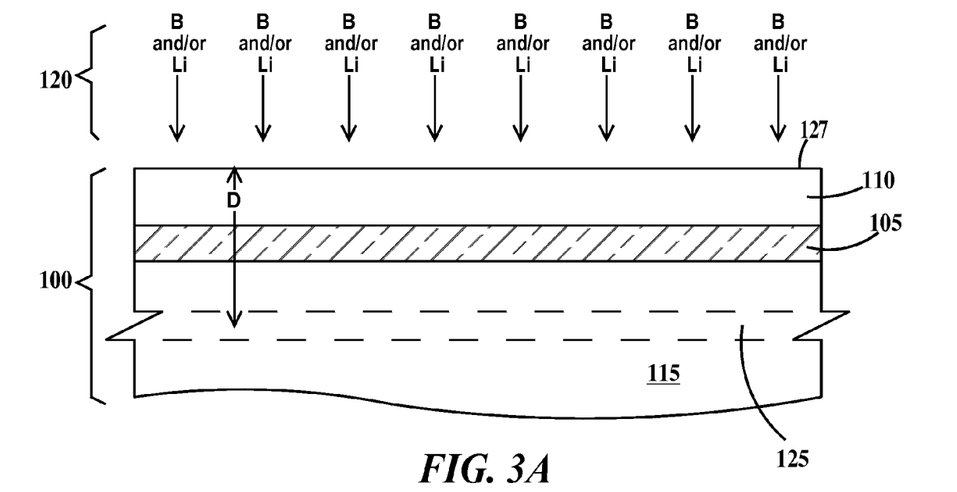
FIGS. 3A and 3B are cross-sectional drawing illustrating a first embodiment of the present invention.
Figure 3B:
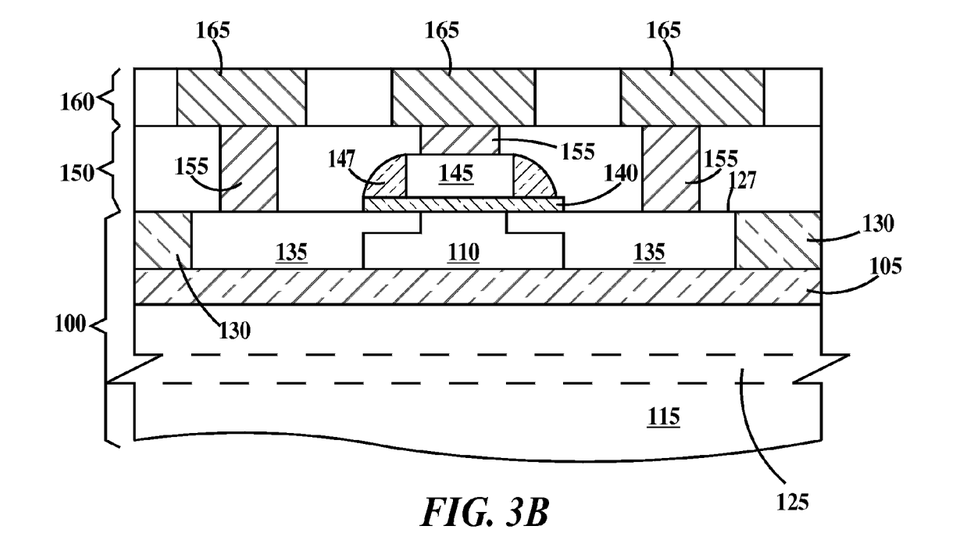

FIGS. 3A and 3B are cross-sectional drawings illustrating a first embodiment of the present invention. In FIG. 3A, a silicon-on-insulator (SOI) substrate 100 comprises a buried oxide layer (BOX) 105 between an upper single-crystal silicon layer 110 and a supporting substrate 115. In one example, supporting substrate 115 is comprises silicon or single-crystal silicon. Substrate 100 is subjected to an ion implantation of $^{10}$B or $^6$Li ions 120 or both $^{10}$B and $^6$Li ions, which form an alpha particle emitting layer 125 in supporting substrate 115. The center of alpha emitting layer 125 is located a distance D from a top surface 127 of substrate 100. D is chosen such that, after all the heat cycles that substrate 100 is subjected to during fabrication of integrated circuits, alpha particle emitting layer 125 is close enough to upper silicon layer 110 for alpha particles emitted when the $^{10}$B or $^6$Li is struck by thermal neutrons to have range greater than the distance between the alpha particle layer and top surface 127 of substrate 100 so the emitted alpha particles pass through upper silicon layer 110. In one example, D is initially (i.e. after ion implantation) between about 2 microns and about 10 microns.

Alternatively, substrate 100 may be a simple single-crystal bulk silicon substrate (i.e. no BOX 105). Optionally, a patterned ion implantation mask may be formed over substrate 100 to block ion-implantation of $^{10}$B or/and $^6$Li into certain regions of substrate 100.

In FIG. 3B, optional shallow trench isolation (STI) 130 has been formed in silicon layer 110 and source/drains 135 formed in silicon layer 135 between STI 130. A gate dielectric layer has been formed over silicon layer 110 between source/drains 135, a gate electrode (e.g., polysilicon gate) 145 formed on the gate dielectric layer, and dielectric sidewall spacers 147 formed on the sides of the gate electrode. Silicon layer 110, source/drains 135, gate dielectric layer 140, gate electrode 145 and spacers 147 comprise an exemplary field effect transistor (FET) which is exemplary of semiconductor devices in which electron-hole pairs can be generated by alpha particles and could cause a soft-fail in circuits using the devices. There may be up to millions of such semiconductor devices in a modern integrated circuit chip. Other semiconductor devices in which electron-hole pairs can be generated by alpha particles include bipolar transistors, diodes and finFETs. Examples of circuits susceptible to soft-errors include but are not limited to, SRAM circuits, DRAM circuits and latch circuits. It should be understood that generally, up to hundreds or thousands of integrated circuits can be formed in substrate 100. An alternative name for substrate 100 is "wafer" during fabrication of integrated circuits. Generally many integrated circuits chips, containing integrated circuits, are fabricated on the same wafer. After dicing individual or singulated integrated circuit chips are produced.

Formed over top surface 127 is a dielectric passivation layer 150 having electrically conductive contacts 155 to source/drains 135 and gate electrode 140 formed therein. Formed over passivation layer 150 is a first interlevel dielectric (ILD) layer 160 having electrically conductive wires 165 formed therein. Wires 165 are in physical and electrical contact with contacts 155. There may be wires in first ILD 160 that are not connected to any contacts shown in FIG. 3B or to any contacts anywhere in passivation layer 150. There may several to tens of ILD layers above first ILD layer 160, each containing electrically conductive wires interconnected to wire devices in substrate 100 together into circuits.

Contacts 155 and wires 165 are illustrated being formed by a damascene process (as are all wires in all embodiments of the present invention), though other process may be used, such as subtractive etching. Wires in ILD layers above ILD layer may be formed by damascene or dual-damascene process or other processes such as subtractive etching.

A damascene process is one in which wire trenches or via openings are formed in a dielectric layer, an electrical conductor of sufficient thickness to fill the trenches is deposited on a top surface of the dielectric, and a chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface the dielectric layer to form dual-damascene wires and dual-damascene wires having integral dual-damascene vias.

When and integrated circuit chip containing alpha particle emitting layer 125 is exposed to an artificial flux of thermal neutrons, alpha particles will be emitted by the fission of $^{10}$B and/or $^6$Li that will cause soft-error fails. Upon removal of the integrated circuit chip from the artificial flux of thermal neutrons, alpha particle generation will essentially cease. (Terrestrial thermal neutrons will generate an insignificant amount of alpha particles that will generate soft-error fails at the insignificant rate described supra.)

Figure 4:
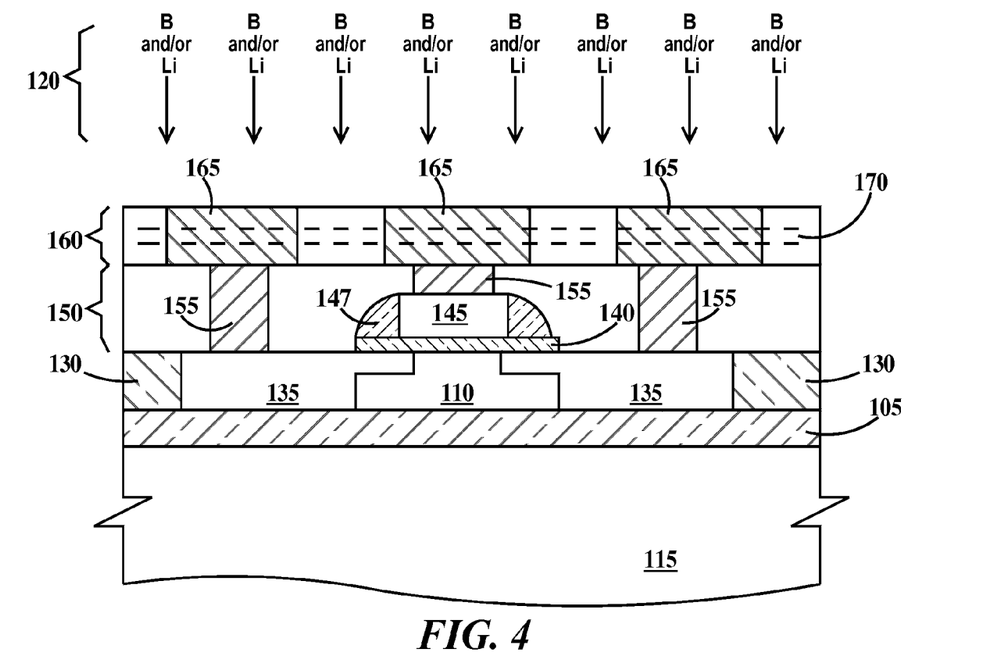
FIG. 4 is a cross-sectional drawing illustrating a second embodiment of the present invention.

FIG. 4 is a cross-sectional drawing illustrating a second embodiment of the present invention. FIG. 4 is similar to FIG.

3B except alpha particle emitting layer 125 has not been formed and the processing is shown after completion of wire formation in first ILD layer 160. In FIG. 4, first ILD layer 160 is subjected to the ion implantation of $^{10}$B or $^{6}$Li ions 120 or both $^{10}$B and $^{6}$Li ions, which form an alpha particle emitting layer 170 in ILD layer 160 and wires 165. Optionally, a patterned ion implantation mask may be formed over first ILD layer 160 to block ion-implantation of $^{10}$B or/and $^{6}$Li into certain wires 165 and regions of the first ILD layer. Since there are very few high temperature heat cycles after formation of first ILD layer 160, the $^{10}$B or/and $^{6}$Li will stay mainly within first ILD 160 and wires 165. After the ion implantation, additional ILD layers and wires may be formed to complete the integrated circuit chips.

When and integrated circuit chip containing alpha particle emitting layer 170 is exposed to the artificial flux of thermal neutrons, alpha particles will be emitted by the fission of $^{10}$B and/or $^{6}$Li that will cause soft-error fails. Upon removal of the integrated circuit chip from the artificial flux of thermal neutrons, alpha particle generation will essentially cease.

Figure 5A:
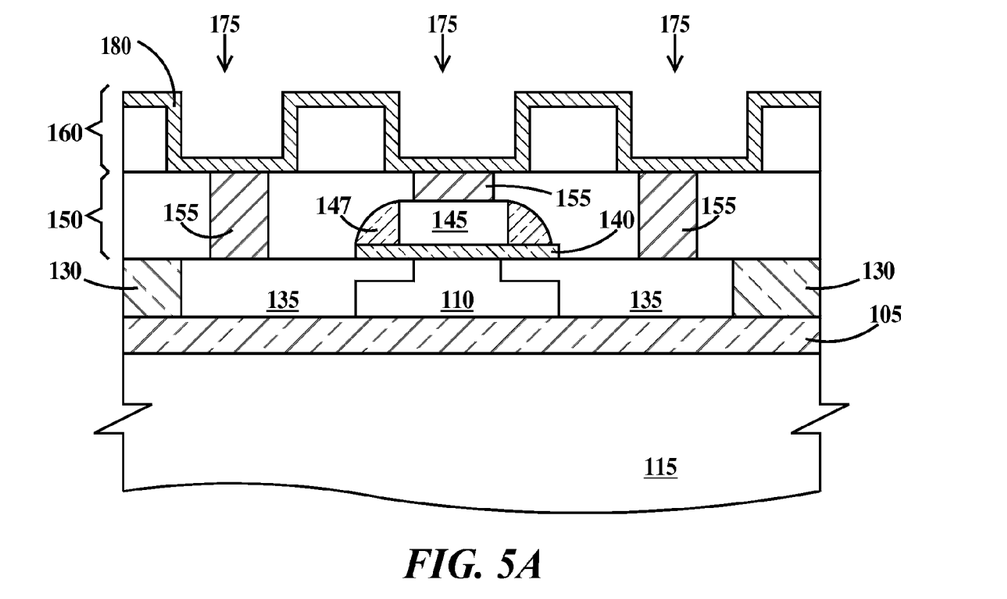
FIGS. 5A through 5C are cross-sectional drawing illustrating a third embodiment of the present invention.
Figure 5B:
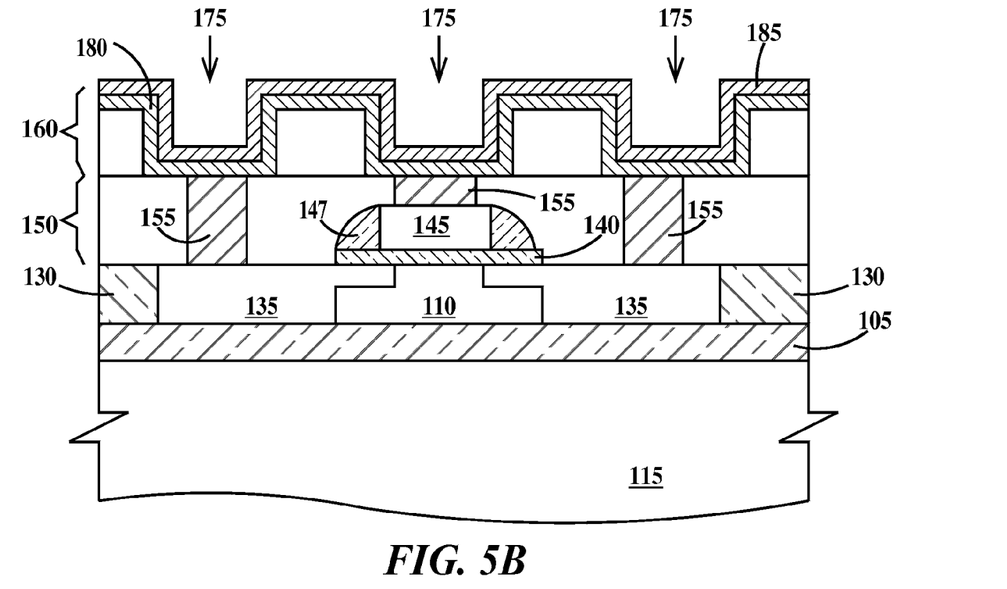
Figure 5C:
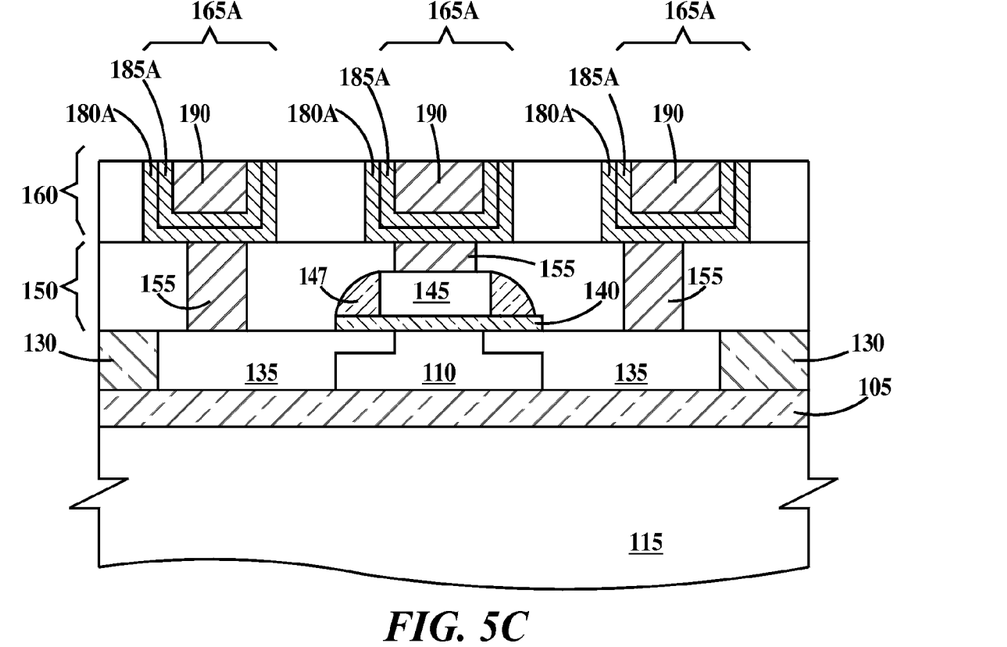

FIGS. 5A through 5C are cross-sectional drawing illustrating a third embodiment of the present invention. FIG. 5A is similar to FIG. 3B up to formation of ILD layer 160. In FIG. 5A, trenches 175 are formed in ILD layer 160 and an electrically conductive conformal layer 180 is formed on the sidewalls and bottoms of trenches 175 and the top surface of ILD layer 160. Conformal layer 180 may be formed, for example, by sputter deposition. In one example, conformal layer 180 comprises, tantalum (Ta), tantalum nitride (TaN), titanium (Ti), titanium nitride (TiN) or combinations thereof. Alternatively, conformal layer 180 may be formed by chemical-vapor deposition (CVD).

In FIG. 5B a conformal doped seed layer 185 comprising copper (Cu) and $^{10}$B, Cu and $^{6}$Li or Cu, $^{10}$B and $^{6}$Li is formed by sputter deposition from a target comprised of Cu and $^{10}$B and/or $^{6}$Li. In sputter deposition, ions (e.g., argon ions) are directed to a target in vacuum chamber and particles of the target are ejected from the target by the ion bombardment and deposit on a substrate placed in the chamber. In one example, a suitable sputtering target comprises between about 10% to about 15% $^{10}$B or 10% to about 15% $^{6}$Li or 10% to about 15% $^{10}$B and $^{6}$Li with the remainder being Cu.

In FIG. 5C, a layer of copper sufficient to fill remaining spaces in trenches 175 (see FIG. 5B) has been electroplated onto conformal seed layer 185 and a CMP performed to expose the top surface of ILD layer 160 between newly formed damascene wires 165A. Wires 165A include liners 180A, seed layers 185A and core conductors 190. Top surfaces of wires 165A are coplanar with the top surface of ILD layer 160.

When and integrated circuit chip containing wires 165A having doped seed layers 185A is exposed to the artificial flux of thermal neutrons, alpha particles will be emitted by fission of the $^{10}$B and/or $^{6}$Li in wires 165A that will cause soft-error fails. Upon removal of the integrated circuit chip from the artificial flux of thermal neutrons, alpha particle generation will essentially cease.

Figure 6A:
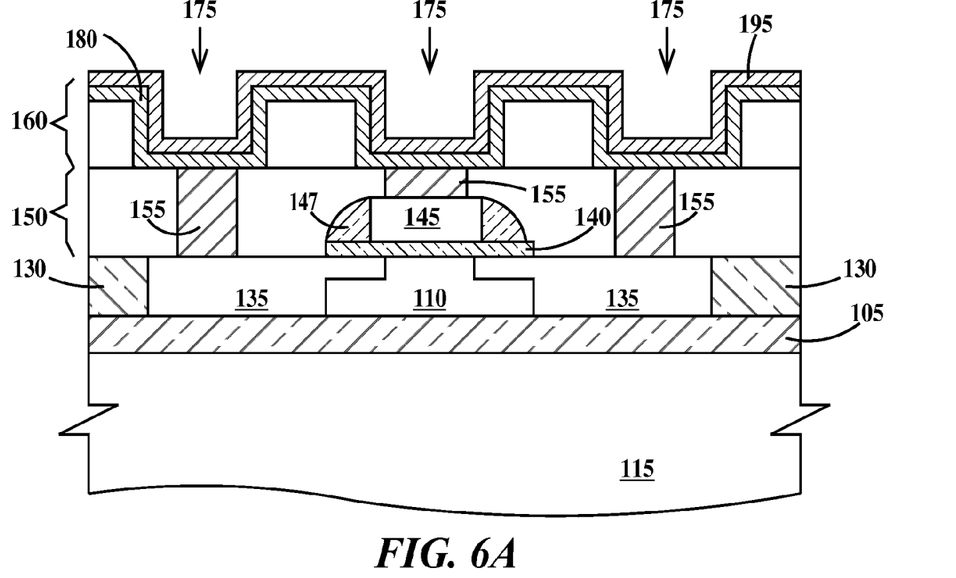
FIGS. 6A and 6B are cross-sectional drawing illustrating a fourth embodiment of the present invention.
Figure 6B:
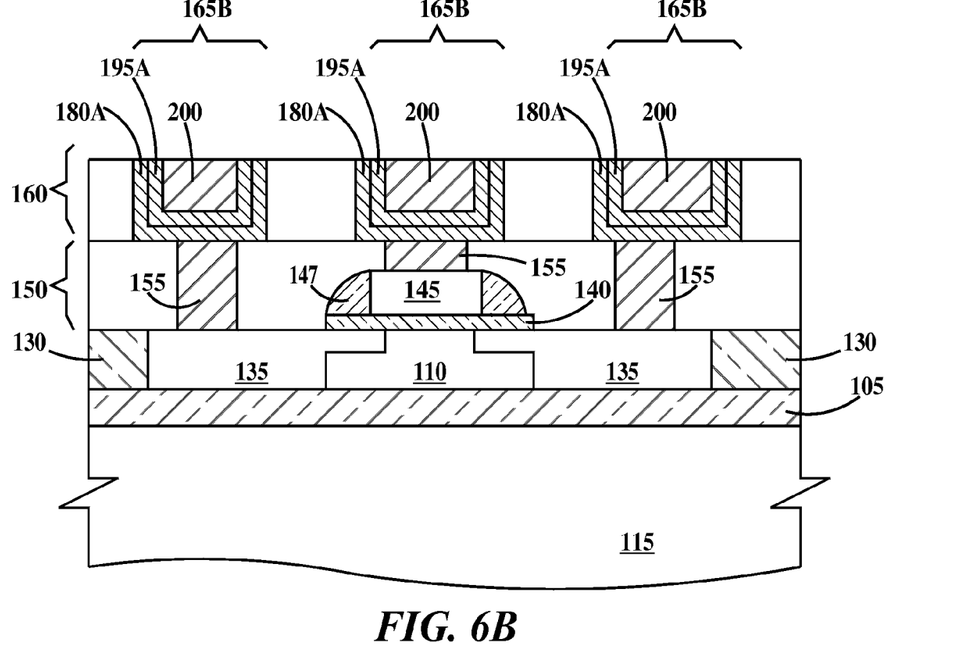

FIGS. 6A and 6B are cross-sectional drawing illustrating a fourth embodiment of the present invention. FIG. 6A is similar to FIG. 5B up to formation of conformal layer 180. In FIG. 6A, a conformal seed layer 195 comprising copper is formed by sputter deposition from a target comprised of Cu.

In FIG. 6B, a layer of copper doped with and $^{6}$Li or Cu, $^{10}$B and $^{6}$Li sufficient to fill remaining spaces in trenches 175 (see FIG. 6A) has been electroplated onto conformal seed layer 195 (see FIG. 6A) and a CMP performed to expose the top surface of ILD layer 160 between newly formed damascene wires 165B. This may be accomplished, for example, using an aqueous plating solution containing $CuSO_4$ and between about 10% by weight and about 15% by weight of all sulfates of $^{10}B_2(SO_4)_3$ and/or $^{6}Li_2SO_4$. Wires 165B include liners 180A, seed layers 195A and doped core conductors 200. Top surfaces of wires 165B are coplanar with the top surface of ILD layer 160.

When and integrated circuit chip containing wires 165B having doped cores 200A is exposed to the artificial flux of thermal neutrons, alpha particles will be emitted by fission of the $^{10}$B and/or $^{6}$Li in wires 165B that will cause soft-error fails. Upon removal of the integrated circuit chip from the artificial flux of thermal neutrons, alpha particle generation will essentially cease.

Figure 7A:
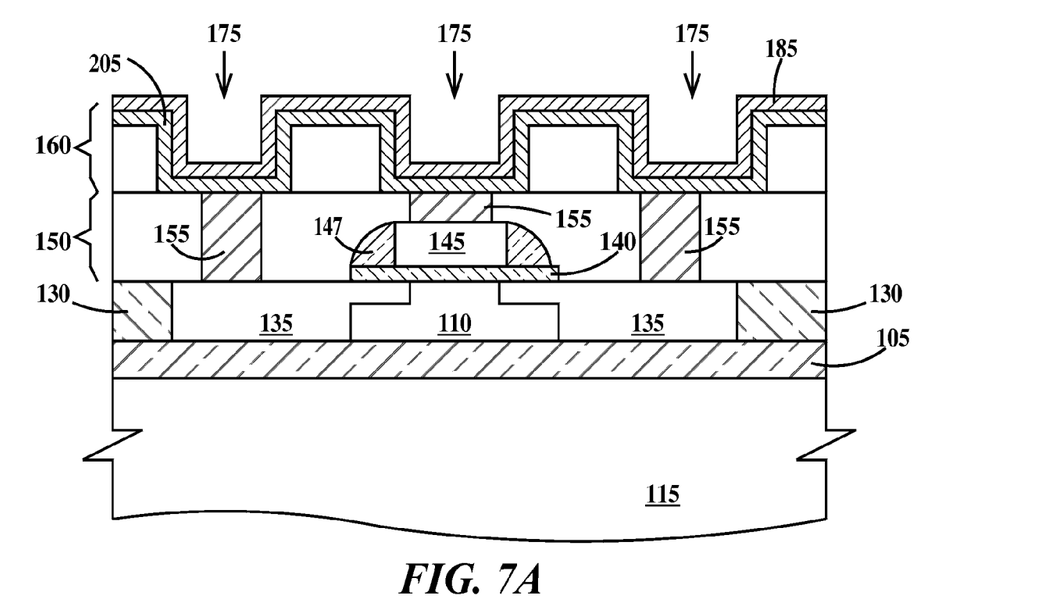
FIGS. 7A and 7B are cross-sectional drawing illustrating a fifth embodiment of the present invention.
Figure 7B:
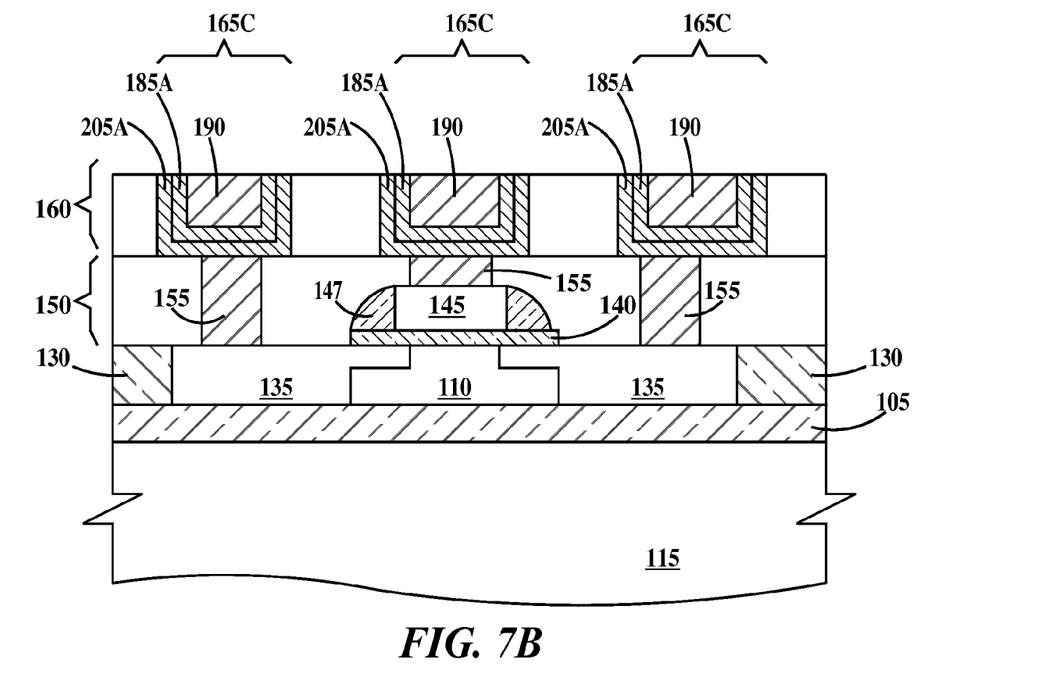

FIGS. 7A and 7B are cross-sectional drawing illustrating a fifth embodiment of the present invention. FIG. 7A is similar to FIG. 5A up to formation of trenches 175. In FIG. 7A, a conformal doped layer 205A is formed instead of conformal layer 180. Conformal doped layer 205 comprises Ta and $^{10}$B, Ta and $^{6}$Li or Ta, $^{10}$B and $^{6}$Li and in one example, is formed by sputter deposition from a target comprised of Ta and $^{10}$B and/or $^{6}$Li. In one example, a suitable sputtering target comprises between about 10% to about 15% by weight $^{10}$B or $^{6}$Li or $^{10}$B and $^{6}$Li with the remainder being Ta.

In FIG. 7B, a layer of copper has been electroplated onto conformal seed layer 185 (see FIG. 7A) and a CMP performed to expose the top surface of ILD layer 160 between newly formed damascene wires 165B. This may be accomplished, in one example, using an aqueous plating solution containing $CuSO_4$. Wires 165C include doped liners 205A, seed layers 185A and core conductors 190. Top surfaces of wires 165C are coplanar with the top surface of ILD layer 160.

When and integrated circuit chip containing wires 165C having doped liners 205A is exposed to the artificial flux of thermal neutrons, alpha particles will be emitted by fission of the $^{10}$B and/or $^{6}$Li in wires 165C that will cause soft-error fails. Upon removal of the integrated circuit chip from the artificial flux of thermal neutrons, alpha particle generation will essentially cease.

Figure 8:
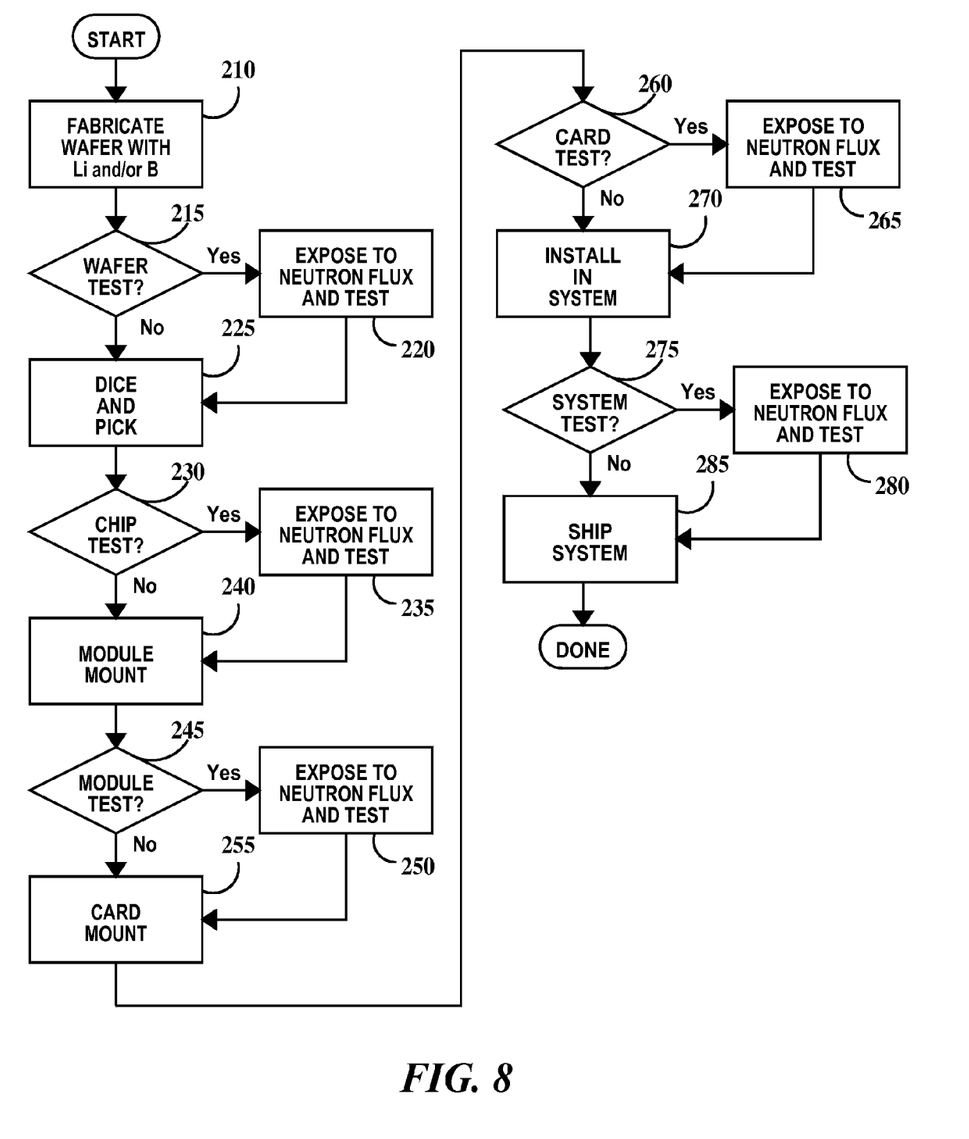
FIG. 8 is a flowchart illustrating a method of testing for soft-error fails according to embodiments of the present invention.

FIG. 8 is a flowchart illustrating a method of testing for soft-error fails according to embodiments of the present invention. In step 210, a wafer containing one or more integrated circuit chips, each integrated circuit chip containing $^{10}$B, $^{6}$Li or both $^{10}$B and $^{6}$Li is fabricated using any of one or more of the methods described supra. In step 215, it is decided if soft-error testing is to be performed at wafer level. If testing is to be performed at wafer level, then in step 220 the wafer is exposed to the artificial flux of thermal neutrons of energies and amounts described supra while soft-error testing is performed, otherwise the method proceeds to step 225. In its most simple form, soft error testing includes loading a test pattern into a known good memory cell or latch, exposing the cell or latch to the artificial thermal neutron flux, and reading out a resultant pattern. If the resultant pattern does not match an expected pattern, then a soft-error has occurred. Normalizing the soft error rate to the neutron flux, and knowing the amount of $^{10}$B, $^{6}$Li or combination of them allows for the determination of a soft-error cross section (fails/fluence).

There seems to me to be a problem. As the flowchart is laid out, it is possible to test at the wafer, chip, module, card and system level. I would think that it would be done only once and a decision would have to be made early on when to do the testing. Maybe you wrote it this way to keep the options open.

After soft-error testing at wafer level the method next proceeds to step 225. Alternatively, soft-error testing of integrated circuit chips may include performing the same tests with and without exposure the integrated circuit chip to an artificial flux of thermal neutrons to establish a baseline failure rate to compare with the failure rate induced by the exposure to the thermal neutron flux.

In step 225 the wafer is diced into individual (e.g., singulated) integrated circuit chips and the known good integrated circuit chips are selected "or picked." In step 230 it is decided if soft-error testing is to be performed at chip level. If testing is to be formed at chip level, then in step 235 the integrated circuit chip(s) is exposed to the artificial flux of thermal neutrons of energies and amounts described supra while soft-error testing is performed, otherwise the method proceeds to step 240. After soft-error testing at chip level, the method proceeds to step 240.

In step 240 the integrated circuit chip are mounted on modules. In step 245 it is decided if soft-error testing is to be performed at module level. If testing is to be formed at module level, then in step 250 the modules containing integrated circuit chip(s) are exposed to the artificial flux of thermal neutrons of energies and amounts described supra while soft-error testing is performed, otherwise the method proceeds to step 255. After soft-error testing at module level, the method proceeds to step 255.

In step 255 the modules are mounted printed circuit boards or cards. In step 245 it is decided if soft-error testing is to be performed at module level. If testing is to be formed at module level, then in step 250 the modules containing integrated circuit chip(s) are exposed to a flux of thermal neutrons of energies and amounts described supra while soft-error testing is performed, otherwise the method proceeds to step 255. After soft-error testing at module level, the method proceeds to step 255.

In step 255 the modules are mounted printed circuit boards or cards. In step 260 it is decided if soft-error testing is to be performed at card level. If testing is to be formed at card level, then in step 265 the cards containing integrated circuit chip(s) are exposed to the artificial flux of thermal neutrons of energies and amounts described supra while soft-error testing is performed, otherwise the method proceeds to step 270. After soft-error testing at card level, the method proceeds to step 270.

In step 270 the cards are installed in a system, such as a personal computer, server, mainframe computer, or other electronic device. In step 275 it is decided if soft-error testing is to be performed at system level. If testing is to be formed at system level, then in step 280 the system containing integrated circuit chip(s) is exposed to the artificial flux of thermal neutrons of energies and amounts described supra while soft-error testing is performed, otherwise the method proceeds to step 285. After soft-error testing at system level, the method proceeds to step 285. In step 285, the system is shipped. If soft-error testing is performed at system level, then the system can be shipped with a soft-error rate specification.

It is possible to mount integrated circuit chips directly to printed circuit boards or flexible printed circuit boards instead of mounting on modules. In this case, steps 240, 45 and 250 are not possible. Conventional yield and reliability testing may be performed immediately prior to any of steps 220, 235, 250, 265 or 280.

The method of testing illustrated in FIG. 8 and described supra, allows sorts to be made based on known soft-error rates and parts containing soft-error tested integrated circuit chips may be shipped to specific customers based on the known soft-error rates.

Thus, the embodiments of the present invention provide method and structures that overcome the deficiencies and limitations for soft error testing of integrated circuits described hereinabove.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. An integrated circuit chip, comprising:
   a silicon substrate;
   a dielectric layer formed over said substrate;
   electrically conductive wires formed in said dielectric layer, said wires interconnecting semiconductor devices formed in said substrate into circuits, top surfaces of said wires coplanar with a top surface of said dielectric layer; and
   an alpha particle emitting region in said integrated circuit chip proximate to one or more of said semiconductor devices.

2. The integrated circuit chip of claim 1, wherein said alpha particle emitting region includes atoms that undergo fission reactions when struck with thermal neutrons, said fission reactions releasing alpha particles.

3. The integrated circuit chip of claim 1, wherein said alpha particle emitting region comprises $^{10}$B, $^{6}$Li or both $^{10}$B or $^{6}$Li atoms.

4. The integrated circuit chip of claim 1, wherein said alpha particle emitting region is a layer in said silicon substrate under said semiconductor devices.

5. The integrated circuit chip of claim 1, wherein said alpha particle emitting region is formed in said electrically conductive wires.

6. The integrated circuit chip of claim 1, wherein said electrically conductive wires are damascene or dual damascene wires comprising:
   an electrically conductive core conductor having opposite top and bottom surfaces and sidewalls, said bottom surface of said core conductor facing a top surface of said substrate;
   an electrically conductive liner formed over said bottom surface and sidewalls of said core conductor; and
   wherein said alpha particle emitting region is said core conductor.

7. The integrated circuit chip of claim 1, wherein said electrically conductive wires are damascene or dual damascene wires comprising:
   an electrically conductive core conductor having opposite top and bottom surfaces and sidewalls, said bottom surface of said core conductor facing a top surface of said substrate;
   an electrically conductive liner formed over said bottom surface and sidewalls of said core conductor; and
   wherein said alpha particle emitting region is said liner.

8. The integrated circuit chip of claim 1, wherein said electrically conductive wires are damascene or dual damascene wires comprising:
   an electrically conductive core conductor comprising a first metal having opposite top and bottom surfaces and sidewalls, said bottom surface of said core conductor facing said a surface of said substrate;
   an electrically conductive seed layer comprising said first metal formed on said bottom surface and sidewalls of said core conductor, said alpha particle emitting region being said seed layer; and an electrically conductive liner comprising a second metal formed on said bottom surface and sidewalls of said seed layer.

9. A method of fabricating an integrated circuit chip, comprising:

forming a dielectric layer over a substrate;

forming electrically conductive wires in said dielectric layer, said wires interconnecting semiconductor devices formed in said substrate into circuits, top surfaces of said wires coplanar with a top surface of said dielectric layer; and forming an alpha particle emitting region in said integrated circuit chip proximate to one or more of said semiconductor devices.

10. The method of claim 9, wherein said alpha particle emitting region includes atoms that undergo fission reactions when struck with thermal neutrons, said fission reactions releasing alpha particles.

11. The method of claim 9, wherein said alpha particle emitting region comprises $^{10}$B, $^6$Li or both $^{10}$B and $^6$Li atoms.

12. The method of claim 9, wherein said alpha particle emitting region is formed by ion implantation of $^{10}$B, $^6$Li or both $^{10}$B and $^6$Li atoms into said substrate under said semiconductor devices.

13. The method of claim 9, wherein said electrically wires are formed by:

forming trenches in said dielectric layer;

sputtering material from a sputter target and depositing said sputtered material on bottom surfaces and sidewalls of said trenches and on a top surface of said dielectric layer to form an electrically conductive liner layer, said sputter target and said liner layer both containing a metal and both containing atoms that undergo a fission reactions when struck with thermal neutrons, said fission reactions releasing alpha particles;

filling remaining space in said trenches with an electrically conductive core layer; and performing a chemical-mechanical-polish to remove said liner layer and said core layer from over said top surface of said dielectric layer, after said chemical-mechanical-polish top surface of said wires being coplanar with said top surface of said dielectric layer.

14. The method of claim 9, wherein said alpha particle emitting region is formed by ion implantation of $^{10}$B, $^6$Li or both $^{10}$B and $^6$Li atoms into said dielectric layer and said wires.

15. The method of claim 9, wherein said electrically wires are formed by:

forming trenches in said dielectric layer;

forming an electrically conductive liner layer on sidewalls and bottoms of said trenches and on a top surface of said dielectric layer;

filling remaining space in said trenches with an electrically conductive core layer by electroplating core material from a plating solution onto said liner layer or onto a seed layer deposited on said liner layer, said plating solution and core conductor layer both containing a metal and both containing atoms that undergo fission reactions when struck with thermal neutrons, said fission reactions releasing alpha particles; and performing a chemical-mechanical-polish to remove said liner layer, said seed layer if present and said core layer from over said top surface of said dielectric layer, after said chemical-mechanical-polish top surface of said wires being coplanar with said top surface of said dielectric layer.

16. The method of claim 9, wherein said electrically wires are formed by:

forming trenches in said dielectric layer;

forming an electrically conductive liner layer on sidewalls and bottoms of said trenches and on a top surface of said dielectric layer;

sputtering material from a sputter target and depositing said sputter material as a seed layer on a top surface of said liner, said sputter target and said seed layer both containing a metal and both containing atoms that undergo fission reactions when struck with thermal neutrons, said fission reactions releasing alpha particles;

filling remaining space in said trenches with an electrically conductive core layer; and performing a chemical-mechanical-polish to remove said liner layer, said seed layer and said core layer from over said top surface of said dielectric layer, after said chemical-mechanical-polish top surface of said wires being coplanar with said top surface of said dielectric layer.

17. A method of testing for soft-error fails comprising:

providing an integrated circuit chip, comprising:

a silicon substrate;

a dielectric layer formed over said substrate;

electrically conductive wires formed in said dielectric layer, said wires interconnecting semiconductor devices formed in said substrate into circuits; and an alpha particle emitting region in said integrated circuit chip proximate to one or more of said semiconductor devices; and testing said integrated circuit chip by exposing said integrated circuit chip to a artificial flux of thermal neutrons while writing test patterns into said integrated circuit and reading out resultant patents from said integrated circuit chip, said flux of artificial thermal neutrons generating alpha particles in said alpha particle emitting region; and comparing said resultant patterns to expected patterns to determine if fails have occurred.

18. The method of claim 17, wherein said is testing is performed when said integrated circuit chip is (i) part of a wafer, (ii) singulated, (iii) mounted to a module, (iv) mounted to a card, (v) mounted to a module mounted on a printed circuit board, (vi) attached to a flexible circuit board, (vii) part of an electronic system or (viii) combinations of (i) through (vii).

19. The method of claim 17, further including:

testing said integrated circuit chip without exposing said integrated circuit to said artificial flux of thermal neutrons while writing test patterns into said integrated circuit chip and reading out resultant patents from said integrated circuit chip and comparing said resultant patterns to expected patterns to determine if fails have occurred; and comparing first result of said testing by exposing to said flux of artificial thermal neutrons with a second result of said testing without exposing to said flux of artificial thermal neutrons.

20. The method of claim 17, wherein said alpha particle emitting region comprises $^{10}$B, $^6$Li or both $^{10}$B and $^6$Li atoms, said artificial flux of thermal neutrons is between about $10^{11}$ n/cm$^2$-sec and about $10^{13}$ n/cm$^2$-sec and comprises neutrons having energies of between about 0.025 eV and about 1.0 eV, and a concentration of $^{10}$B, $^6$Li or both $^{10}$B and $^6$Li atoms in said alpha particle region is less than that required to generate a detectable number of said fails from a terrestrial neutron flux during said testing.

* * * * *